(12) United States Patent
Gosavi et al.

(10) Patent No.: US 11,605,624 B2
(45) Date of Patent: Mar. 14, 2023

(54) FERROELECTRIC RESONATOR

(71) Applicant: Intel Corporation, Santa Clara, CA (US)

(72) Inventors: Tanay Gosavi, Hillsboro, OR (US);
Chia-ching Lin, Portland, OR (US);
Raseong Kim, Portland, OR (US);
Ashish Verma Penumatcha, Hillsboro, OR (US); Uygar Avci, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 923 days.

(21) Appl. No.: 16/238,421

(22) Filed: Jan. 2, 2019

(65) Prior Publication Data
US 2020/0212532 A1     Jul. 2, 2020

(51) Int. Cl.
*H01L 27/02*     (2006.01)
*H01L 49/02*     (2006.01)

(52) U.S. Cl.
CPC .......... *H01L 27/0218* (2013.01); *H01L 28/56* (2013.01)

(58) Field of Classification Search
None
See application file for complete search history.

(56) References Cited

U.S. PATENT DOCUMENTS

| 9,663,346 B1 | 5/2017 | Bahr et al. | |
| 10,020,360 B1* | 7/2018 | Ramaswamy | H01L 27/0805 |
| 2017/0103988 A1 | 4/2017 | Nishida et al. | |
| 2017/0222126 A1 | 8/2017 | Krivokapic et al. | |
| 2017/0287979 A1* | 10/2017 | Manipatruni | G11C 11/161 |
| 2019/0267328 A1* | 8/2019 | Fumagalli | H01L 23/5329 |
| 2019/0386637 A1 | 12/2019 | Plesski et al. | |
| 2020/0105773 A1* | 4/2020 | Morris | H01L 27/11504 |
| 2020/0212194 A1* | 7/2020 | Gosavi | H01L 29/7851 |
| 2020/0212532 A1* | 7/2020 | Gosavi | H01P 7/105 |
| 2020/0411695 A1 | 12/2020 | Sung et al. | |
| 2021/0305398 A1* | 9/2021 | Chang | H01L 27/11507 |

FOREIGN PATENT DOCUMENTS

| DE | 112015001507 T5 * | 12/2016 | G11C 13/0021 |
| WO | WO-2019005143 A1 * | 1/2019 | |

* cited by examiner

*Primary Examiner* — Steven M Christopher
(74) *Attorney, Agent, or Firm* — Essential Patents Group, LLP

(57) ABSTRACT

Describe is a resonator that uses ferroelectric (FE) material in a capacitive structure. The resonator includes a first plurality of metal lines extending in a first direction; an array of capacitors comprising ferroelectric material; a second plurality of metal lines extending in the first direction, wherein the array of capacitors is coupled between the first and second plurality of metal lines; and a circuitry to switch polarization of at least one capacitor of the array of capacitors. The switching of polarization regenerates acoustic waves. In some embodiments, the acoustic mode of the resonator is isolated using phononic gratings all around the resonator using metal lines above and adjacent to the FE based capacitors.

25 Claims, 15 Drawing Sheets

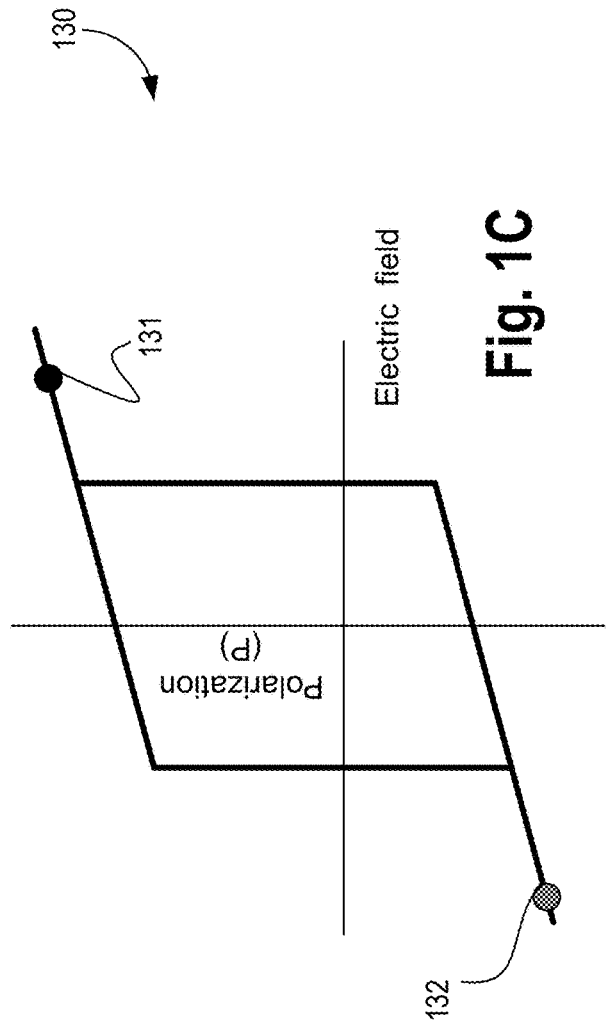
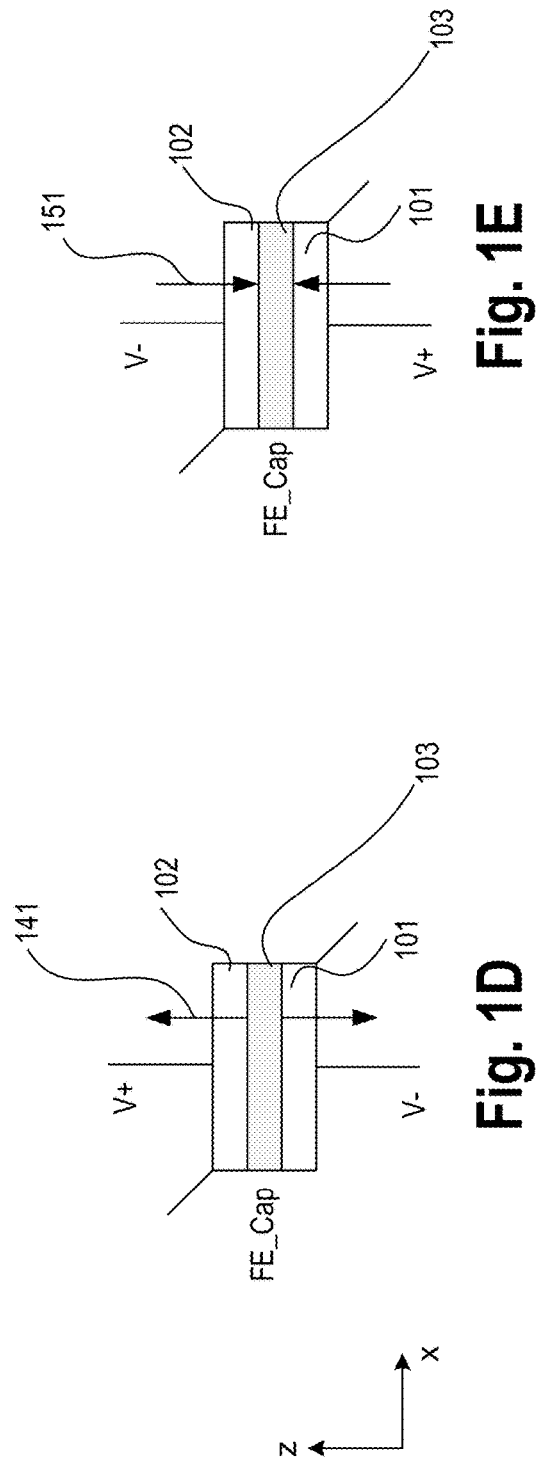
Fig. 1C
Fig. 1D
Fig. 1E

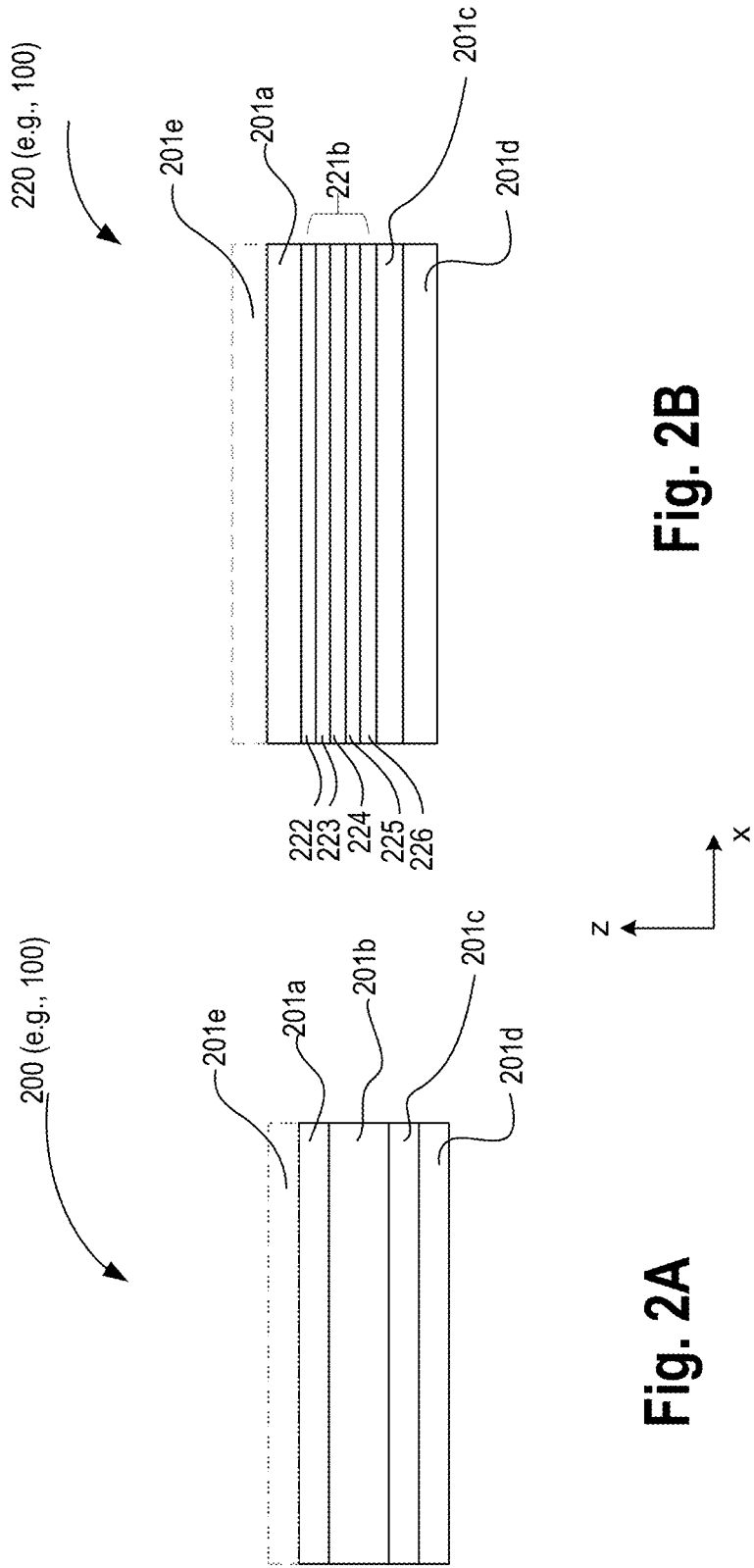

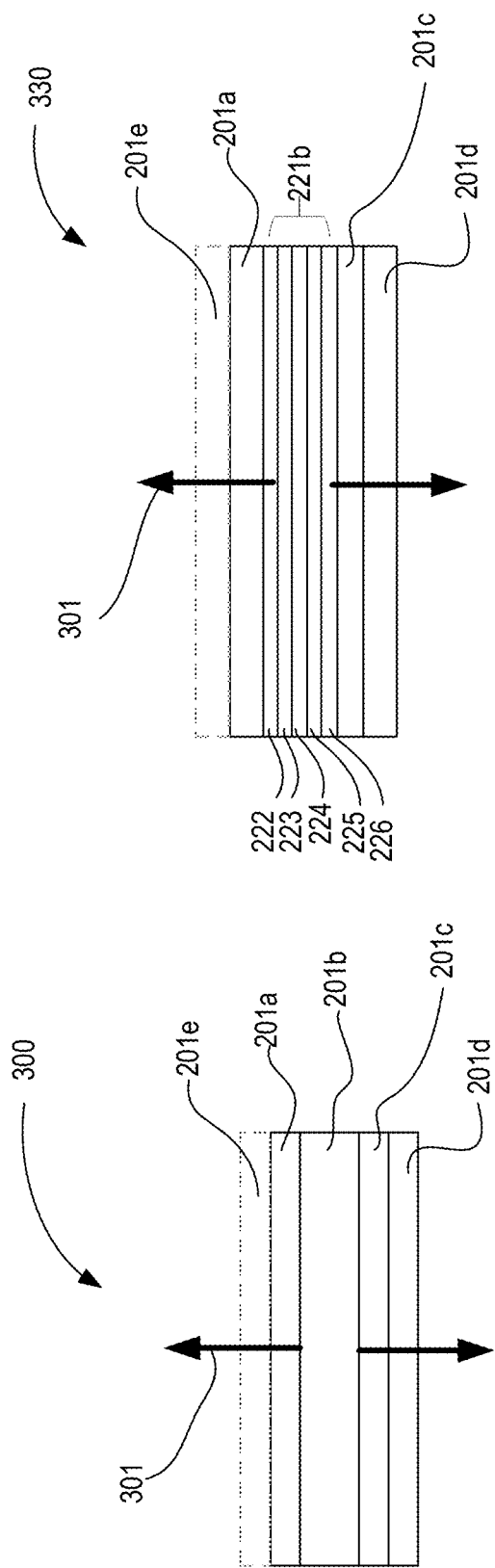
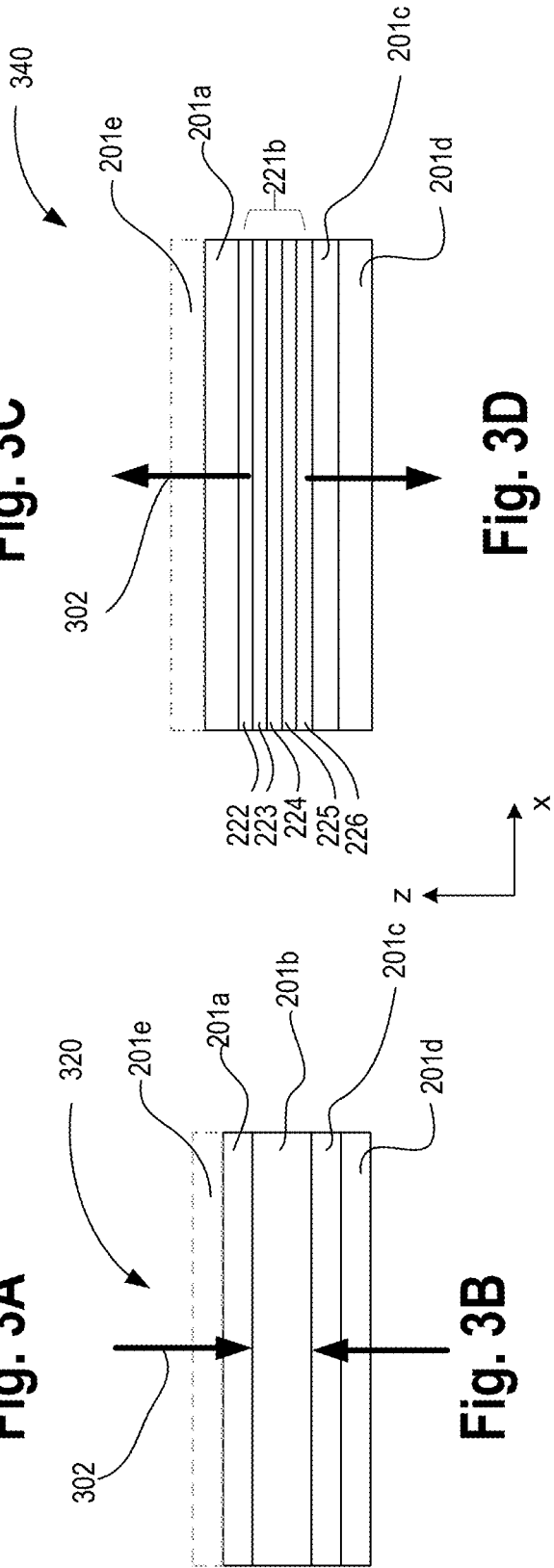

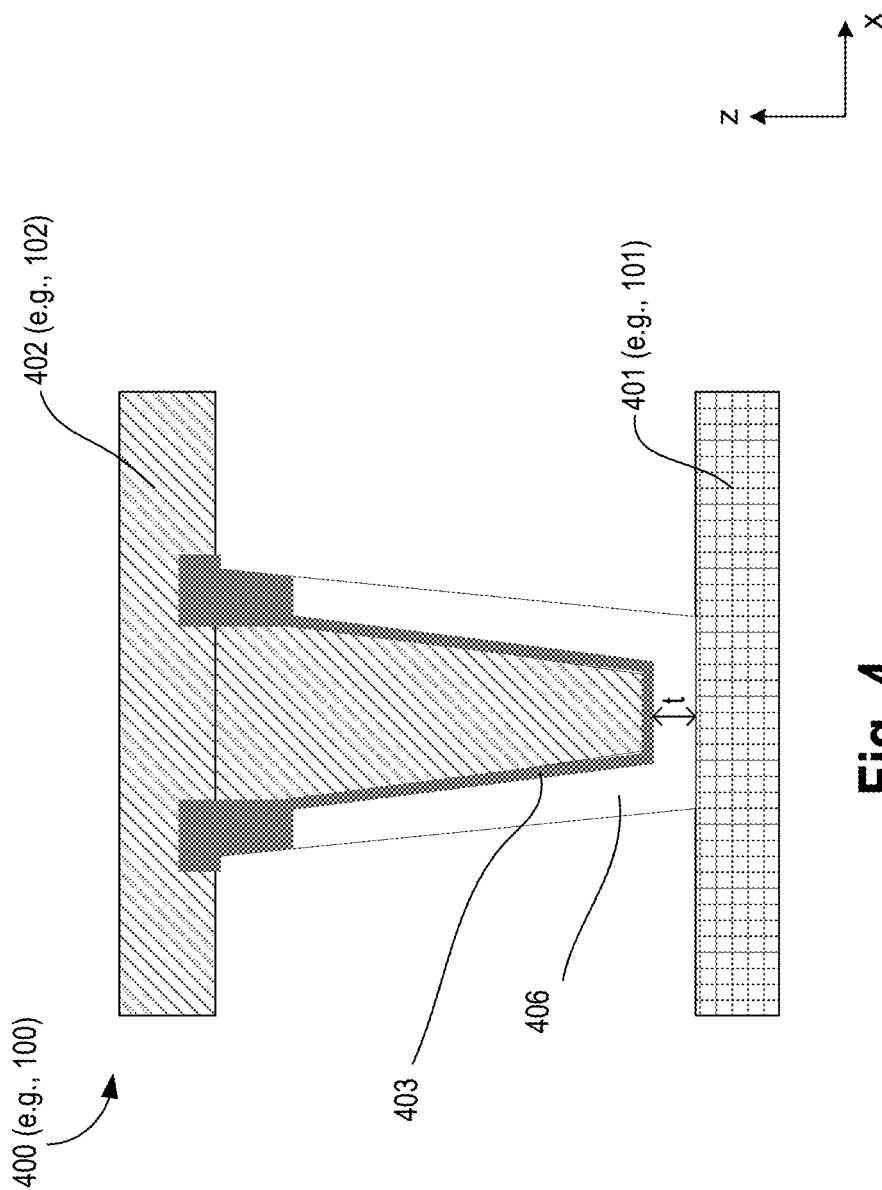

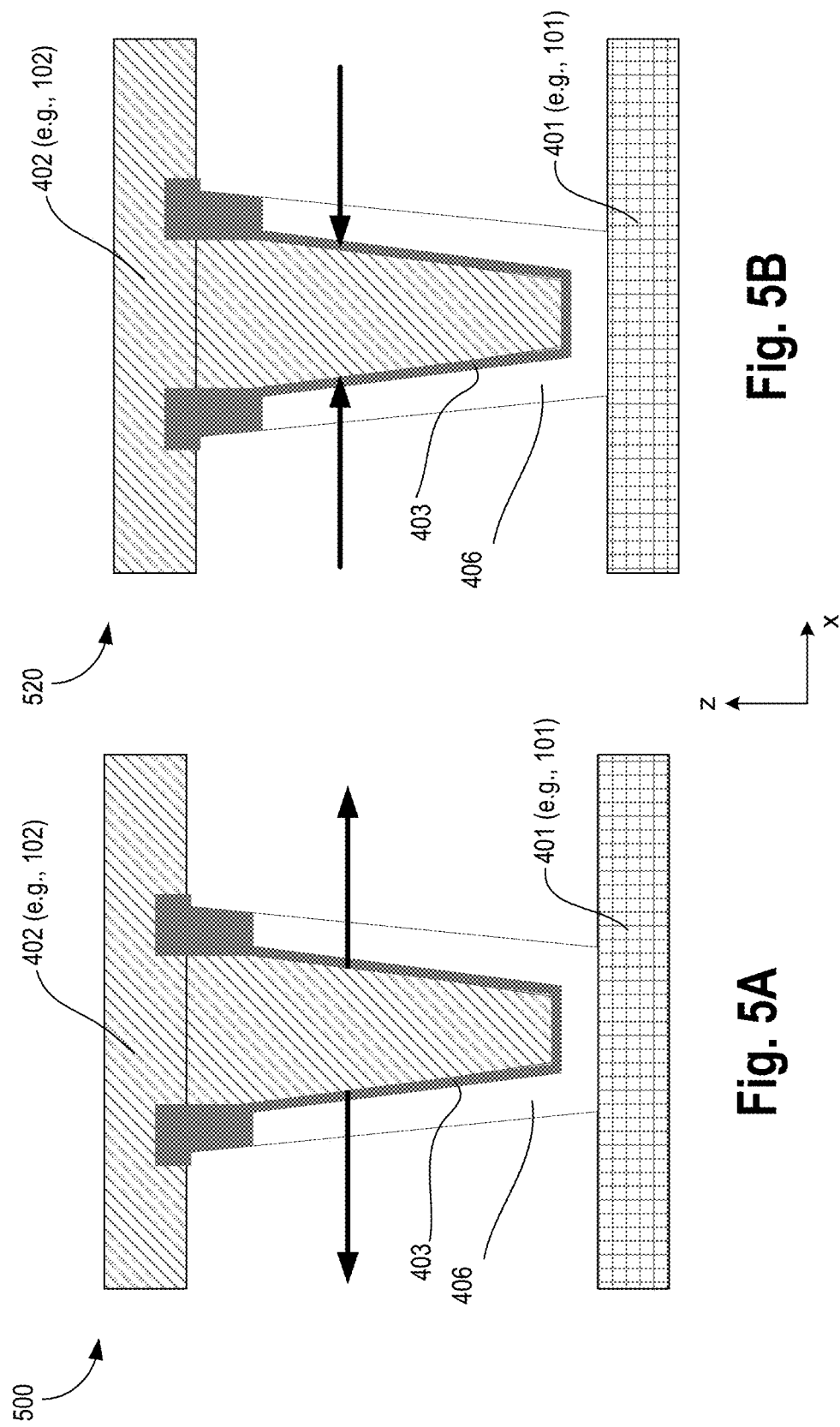

FERROELECTRIC RESONATOR

BACKGROUND

An oscillator may include an electric circuit that produces a periodically varying output at a controlled frequency. Filters may be implemented in circuits that selectively pass certain elements of a signal while eliminating other elements of the signal. A resonator may include circuitry that exhibits resonant behavior (e.g., naturally oscillates at resonant frequencies with greater amplitude than at other non-resonant frequencies). Oscillators, filters, resonators and the like may use quartz crystal, inductors, and/or capacitors to generate or promote certain signal frequencies. Clocking circuits and communication circuits in current Complementary Metal Oxide Semiconductor (CMOS) chips rely on using LC (inductor-capacitor) voltage controlled oscillators in phased lock loops (PLLs) with an external crystal oscillator signal. Use of inductors creates challenges in scaling the circuits down. Inductors also cause cross-coupling between different circuits and they have poor yield. Inductor-less oscillator circuits are needed to integrate multiple frequencies on CMOS chips and scale the size of the chips further. On the other hand, an on-chip high performance oscillator can also get rid of external clock references, which makes the packaging of mobile systems challenging and needs extra signal power.

Conventional oscillators, filters, resonators and the like may use quartz crystal, inductors, and/or capacitors to generate or promote certain signal frequencies. Such components can be expensive, unstable, and/or have too large of a footprint (making them less suitable for inclusion on, for example, a "system on a chip" (SoC) that may include logic circuits as well). These shortcomings are becoming more critical considering the need for oscillators, filters, and resonators is increasing. For example, the number of frequency bands in a wireless system is growing, and consequently so is the number of required filters. Conventional resonators, such as film bulk acoustic resonators (FBAR), are not integrated with major components of wireless systems, such as complementary metal-oxide-semiconductor (CMOS) radio frequency (RF) transceiver circuits. Due to this non-integration, the circuits require special packaging, which is costly in terms of real estate and finances.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1C illustrates a plot showing hysteresis property of ferroelectric material, in accordance with some embodiments.

FIGS. 1D-E illustrate actuation of the FE-Caps, respectively, along the z-direction, in accordance with some embodiments.

FIG. 2A illustrates a cross-section of a material stack used for forming a ferroelectric capacitive structure, according to some embodiments.

FIG. 2B illustrates a cross-section of a super-lattice material stack used for forming a ferroelectric structure such as structure of FIG. 1A, according to some embodiments.

FIG. 3A illustrates the outward actuation (e.g., expansion) of FE-Cap structure of FIG. 2A, in accordance with some embodiments.

FIG. 3B illustrates the inward actuation (e.g., contraction) of FE-Cap structure of FIG. 2A, in accordance with some embodiments.

FIG. 3C illustrates the outward actuation (e.g., expansion) of FE-Cap structure of FIG. 2B, in accordance with some embodiments.

FIG. 3D illustrates the inward actuation (e.g., contraction) of FE-Cap structure of FIG. 2B, in accordance with some embodiments.

FIG. 4 illustrates a FE-Cap on a bit line (COB) structure used for generating strain/stress, in accordance with some embodiments.

FIGS. 5A-B illustrate the FE-Cap of FIG. 4 with strain causing expansion of the COB structure in presence of positive voltage and first polarization, and strain causing contraction of the COB structure with second polarization, respectively, in accordance with some embodiments.

DETAILED DESCRIPTION

Figure 1B:
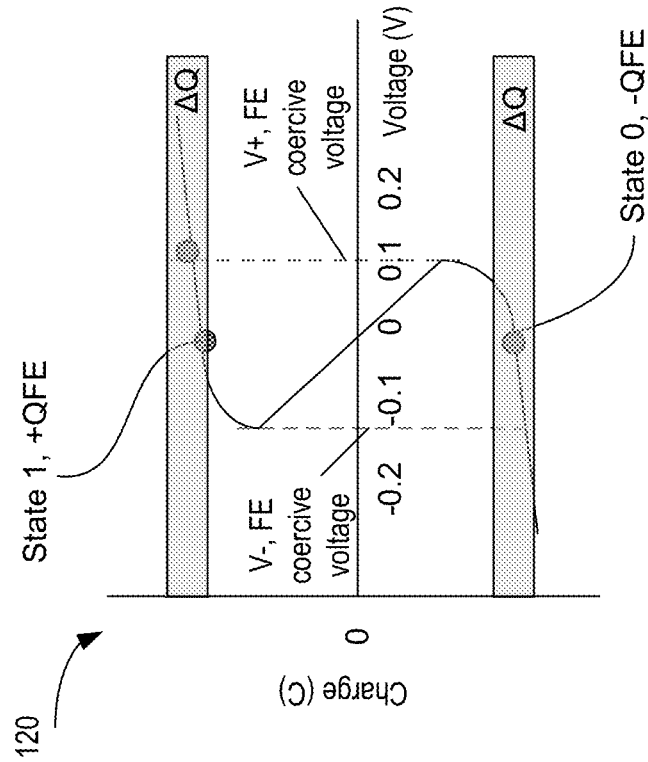
FIG. 1B illustrates a plot showing charge versus voltage function of the FE-Cap, its memory states, and imprint charge.

Some embodiments use ferroelectric materials for use as a resonator. In some embodiments, capacitive devices of ferroelectric material, herein referred to as FE-Caps, actuate in response to applied voltage across it. As such, a resonating wave can be realized. The FE-Cap based resonator can be implemented as metal-insulator-metal (MIM) planar structure or as a capacitor on the bit (COB) line structure. In some embodiments, the resonator fabricated in the backend of the line, is unreleased, and embedded in an interlayer dielectric (ILD).

The FE material may be formed from any appropriate ferroelectric material. In one embodiment, the ferroelectric material comprises hafnium and oxygen, such as hafnium oxide. The hafnium oxide can be doped, for example by silicon, zirconium, lanthanum, aluminum, and the like, and may have dopant concentrations between about 3% and 30% by weight. The ferroelectric material can be formed by well-known techniques, such as by depositing a gate electrode material, such as atomic layer deposition ("ALD").

In some embodiments, the acoustic mode of the resonator is isolated using phononic gratings all around the resonator using the metal line(s) above and adjacent to the ferroelectric capacitor structures. In some embodiments, to increase the signal from the ferroelectric resonators, arrays of them can be connected together as a single resonator. The size of the array and the acoustic frequency mode of operation can be changed by using a transistor in series with the individual capacitor. By changing the direction of current and relative bias between the capacitor top plate and the transistor, ferroelectric materials can be polled in a different orientation such that positive signal can cause expansion or compression. This property is used to change the acoustic mode of operation in the plate. The change in the acoustic mode changes the frequency of operation as well. This enables the resonator array to be frequency programmable. Here, the term "poll" refers to switching of polarization of the FE material.

The resonator of various embodiments has many applications that can be used in CMOS/RF circuits. Due to typically large quality factors (QF) of the MEMS (Micro Mechanical Electrical Systems) acoustic resonators, the jitter and phase noise performance of the oscillators based on these resonators have much better performance (e.g., higher QF). Other applications can be bandpass or notch filters. Based on FE materials, the piezoelectric coefficients of the materials is large and hence have high transduction efficiency than typical capacitive versions.

There are many technical effects of the various embodiments. For example, the FE-Caps organized in an array with metal wires above, below, and/or on the sides of the FE-caps allows for an acoustic waveguide made inside an integrated circuit die. The resonator and/or oscillators made from the FE-Caps allows for further scaling of CMOS clock networks and communication chips. The resonator and/or oscillators made from the FE-Caps enables new applications like on-chip band-pass filters, notch filters, high-frequency oscillators and other RF components like circulators and isolators. The resonator and/or oscillators made from the FE-Caps enables components for creating neuromorphic coupled oscillator systems. Due to a high quality factor of MEMS (micro-electro-mechanical system) devices, the resonators of various embodiments can enable low jitter high-performance circuits. Some embodiments provide improvements over on-chip resonators that use resonant body transistors (RBT). Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +1-10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

Figure 1A:
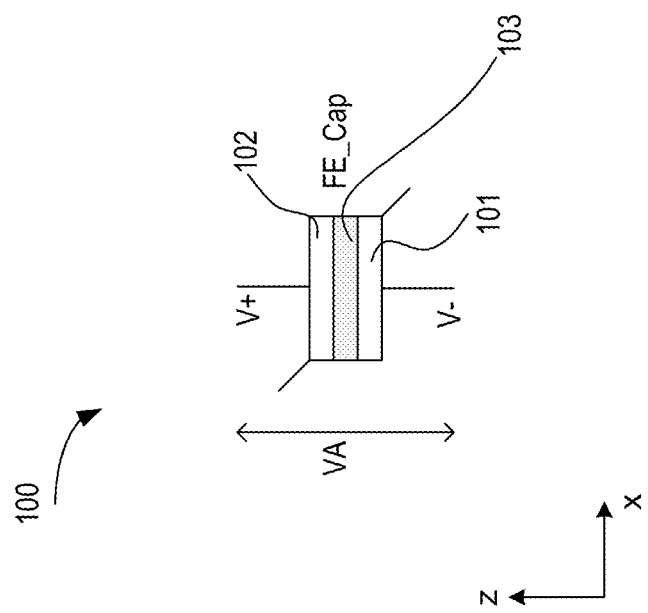
FIG. 1A illustrates a schematic of a ferroelectric capacitor (FE-Cap).

FIG. 1A illustrates schematic of a ferroelectric capacitor (FE-Cap) 100. FIG. 1B illustrates plot 120 showing charge versus voltage function of the FE-Cap, its memory states, and imprint charge. FE-cap 100 generally comprises two metal layers 101 and 102 and ferroelectric material 103 coupled between them. Unlike a normal dielectric based capacitor, a ferroelectric capacitor uses polarization charge to store the memory states, where positive and negative polarization charge indicates state "1" or "0". To switch an FE-cap, the applied FE-cap voltage VA is be higher than the ferroelectric coercive voltages (which behave as threshold voltages) when driven by a voltage source. For example, VA is greater than V+ for 0 to 1 state switching, and VA is less than V− for 1 to 0 state switching.

FIG. 1C illustrates plot 130 showing hysteresis property of ferroelectric structure 103, in accordance with some embodiments. A ferroelectric material exhibits ferroelectricity which is a property by which a spontaneous electric polarization can be revered by an electric field (e.g., applied voltage). When dielectric materials are polarized, the induced polarization 'P' is almost exactly proportional to the applied external electric field E. In such materials, the polarization is a linear function of the applied electric field or voltage. Ferroelectric materials, on the other hand, demonstrate a spontaneous non-zero polarization even when the applied electric field E is zero. As such, the spontaneous polarization can be reversed by an applied electric field in the opposite direction. This results in a hysteresis loop because the polarization of a ferroelectric material is dependent not only on the present electric field but also on its history. The hysteresis loop of plot 130 shows two stable operating positions for FE 103—position 131 and position 132.

These two stable positions indicate that the direction of polarization can be switched (e.g., polled) from one to another and this changes the response of polarization to applied AC voltage. The switching of polarization modifies the strain response to applied voltage or electric field, and as such the ferroelectric capacitor formed by ferroelectric material 106 can physically expand or contract.

FIGS. 1D-E illustrate actuation of the FE-Caps, respectively, along the z-direction, in accordance with some embodiments. The expansion and contraction along the z-axis is shown by indicators 141 and 151, respectively. For example, at operating point 131 on the hysteresis plot 130, FE material 103 expands while at operating point 132 on the hysteresis plot 130, FE material 103 contracts. While FE-Cap in FIGS. 1D-E illustrate actuation along the z-direction, other FE-caps can be fabricated that result into actuation along the x-axis.

In some embodiments, FE 103 is a dielectric layer which is crystalline and includes oxygen and a dopant. FE is utilized as a dielectric layer 103 to provide excess charge through the principle of electric polarization. FE 103 exhibits two stable multiple operating positions along its polarization vs. electric field hysteresis loop. These two stable operating positions are 1) with positive electric field and positive polarization (e.g., state 131), and 2) with negative electric field and negative polarization (e.g., state 132). In FE 103, the polarization can be switched by applying an AC voltage across FE 103. By switching the polarization, the strain response of FE 103 changes. By changing the strain response, the FE-Cap can physically expand or contract. For example, the FE-Cap can expand outwards or inwards along the x-direction (or y-direction) or the x-y plane of the device. Depending on the structure of the FE-Cap, the expansion and contraction can also occur along the z-direction. This expansion and contraction causes resonation, and forms the basis of a resonator, in accordance with various embodiments.

The ferroelectric material 103 may be formed from any appropriate ferroelectric material. In one embodiment, the ferroelectric material 106 comprises hafnium and oxygen, such as hafnium oxide. The hafnium oxide can be doped, for example by silicon, zirconium, lanthanum, aluminum, and the like, and may have dopant concentrations between about 3 and 30% by weight. The ferroelectric material 106 can be formed by well-known techniques, such as by depositing a gate electrode material, such as atomic layer deposition ("ALD"). In some embodiments, FE material 103 also includes $HfO_2$ based material that are generated in pure $HFO_2$ with orthorhombic phase. The thickness (along the z-direction) of the FE material 103 can be in the range of 0.5 nm to 15 nm. In some embodiments, the thickness (along the z-direction) of the FE material 103 can be about 100 nm.

FIG. 2A illustrates a cross-section of a material stack 200 (e.g., 100) used for forming a ferroelectric capacitive structure, according to some embodiments. In some embodiments, ferroelectric capacitive structure 200 comprises a stack of layers including first conductive layer 201a, a layer 201b comprising perovskite, a second conductive layer 201c, and a conductive seed layer 201d. In some embodiments, first and second conductive layers 201a/c are conductive oxides that include one of the following elements: Sr, Ru, La, Sr, Mn, Nb, Cr, or O. In some embodiments, first and second conductive layers 201a/c are conductive oxides which comprise: $SrRuO_3$, $(La,Sr)CoO_3$ [LSCO], $La_{0.5}Sr_{0.5}Mn_{1-x}Ni_xO$, Cu-doped $SrFe_{0.9}Nb_{0.1}O_3$, $(La,Sr)CrO_3$.

In some embodiments, layer 201b comprising perovskite is sandwiched between first and second conductive layers 201a/c such that layer 201b is adjacent to first and second conductive layers 201a/c. In some embodiments, layer 201b comprises a low leakage perovskite. Perovskites have cubic structure with a general formula of $ABO_3$, where 'A' includes one of an alkaline earth or rare earth element (e.g., Sr, Bi, Ba, etc.) while 'B' is one of a 3d, 4d, or 5d transition metal element (e.g., Ti, Fe, etc.). In some embodiments, layer 132b includes one of $SrTiO_3$, $BiFeO_3$, $BiTiO_3$, or $BaTiO_3$.

In some embodiments, a seed layer (or starting layer) 201d is deposited first and then layers 201c, 201b, 201a are deposited. In some embodiments, the seed layer 201d is used to template the conductive layer 201c. In some embodiments, a seed layer 201e is deposited in addition to or instead of 201d. In some embodiment seed layer 201d/e includes one of: Ti, Al, Nb, La, or STO ($SrTiO_3$). In some embodiments, seed layer 201d/e includes one of: TiAl, Nb doped STO, or La doped STO. In some embodiments, layers 201e (or 201a) and 201d (or 201c) are coupled to metal lines directly or through vias.

FIG. 2B illustrates a cross-section of a super-lattice material stack 220 used for forming a ferroelectric structure such as structure 100 or 103 of structure 100, according to some embodiments. In some embodiments, perovskite layer 201b is replaced by super lattice 221b. In some embodiments, super lattice 221b includes alternating layers of materials. For example, layer 222 comprises $PbTiO_3$, layer 223 comprises $SrTiO_3$, layer 224 comprises $PbTiO_3$, layer 225 comprises $SrTiO_3$, layer 226 comprises $PbTiO_3$, and so on (e.g., 2 to 100 times). In some embodiments, one layer can be a non-polar oxide of the type ($A^{+2}B^{+4}O_3$) such as $SrZrO_3$, and another layer can be a polar oxide of the type ($A^{+1}B^{+5}O_3$ or $A^{+3}B^{+3}O_3$) such as $LaAlO_3$ and $LaGaO_3$, where 'A' can comprise one of: La, Sr, Pb, Pr, Nd, Sm, Gd, Y, Tb, Dy, Ho, Er, Tm, Lu, Ce, Li, Na, K, Rb, or Ag, and 'B' can comprise Ga, Al, Sc, In, Ta, Ti, or Zr.

As more alternating layers of $PbTiO_3$ (PTO) and $SrTiO_3$ (STO) are added, the capacitor can store more charge. In some embodiments, the two or more layers of super lattice 201b has a thickness that extends from the first metal layer 201a to the second metal layer 201c. In some embodiments the thickness is in a range of 2 nm (nanometers) to 100 nm. In some embodiments, the two or more layers of super lattice 201b have a width which is perpendicular to the thickness, and wherein the width is in a range of 5 nm to 100 nm. In some embodiments, the super lattice is formed with PTO/STO (e.g., repeated 2 to 100 times) for capacitance enhancement. In some embodiments, the super lattice comprises of materials with improper ferroelectricity (e.g., STO/PTO, $LuFeO_3/LuFe_2O_4$).

FIG. 3A illustrates a depiction 300 of an outward actuation (e.g., expansion) of FE-Cap structure of FIG. 2A, in accordance with some embodiments. The FE-Cap of FIG. 2A is an example of a metal-insulator-metal (MIM) capacitor structure. This MIM structure can be formed in the backend of a die. Here, the insulator of the MIM capacitor structure is a ferroelectric material structure comprising layers 201a-d (or 201a-e). In some embodiments, the layer 201b comprises hafnium and oxygen, such as hafnium oxide. The hafnium oxide can be doped, for example by silicon, zirconium, lanthanum, aluminum, and the like, and may have dopant concentrations between about 3% and 30% by weight.

The arrows 301 shows the direction of expansion for the ferroelectric material in the presence of an external voltage applied across the conductive metals 201a and 201c. In some embodiments, the voltage is applied across 201e and 201d. By changing the voltage across the FE material, the direction of the polarization of ferroelectric material can be polled (or switched) and this polling is used to change the response to the applied drive voltage. As such, the response of an array of resonators formed of FE-Caps structures of FIG. 2A is changed in the backend. In this example, the expansion occurs in the z-direction.

FIG. 3B illustrates a depiction 320 of an inward actuation (e.g., contraction) of FE-Cap structure of FIG. 2A, in accordance with some embodiments. The arrows 302 shows the direction of contraction for the ferroelectric material in the presence of an external voltage applied across the conductive metals 201a and 201c. In some embodiments, the voltage is applied across 201e and 201d. By changing polarization of the FE material between states 131 and 131 (as discussed with reference to FIG. 1C), acoustic wave is generated by the FE-caps.

FIG. 3C illustrates depiction 330 of an outward actuation (e.g., expansion) of FE-Cap structure of FIG. 2B, in accordance with some embodiments. FIG. 3D illustrates a depiction 340 of an inward actuation (e.g., contraction) of FE-Cap structure of FIG. 2B, in accordance with some embodiments. The same principles discussed with reference to FIGS. 3A-B are used for the MIM capacitors of FIGS. 3C-D. In some embodiments, the supper-lattice based FE-Cap of FIG. 2B provides higher capacitance and therefore stronger acoustic waves. In some embodiments, by changing the FE structure of the FE-caps, the wavelength (and hence the frequency) of the acoustic waves can be modified. In some embodiments, by changing the voltage across the FE material and/or current through a transistor coupled in series with the FE-Cap, the wavelength (and hence the frequency) of the acoustic waves can be modified.

FIG. 4 illustrates FE-Cap structure 400 (e.g., 100) on a bit line (COB) structure used for generating strain/stress, in accordance with some embodiments. Capacitor on the bit line structure usually used for DRAM (dynamic random access memory) or for Ferroelectric RAM (random access memory) can be used for generating strain/stress. Structure 400 comprises first metal layer 401 (e.g., one or more of: Cu, Al, Ag, Au, Graphene, Nd, W, TiN, WN, Co, Ru, TaN, etc.), second metal layer 402 (e.g., one or more of: Cu, Al, Ag, Au, Graphene, Nd, W, TiN, WN, Co, Ru, TaN, etc.), intermediate metal layer 403 (e.g., one or more of: Cu, Al, Ag, Au, Graphene, Nd, W, TiN, WN, Co, Ru, TaN, etc.), FE material 406 (e.g., FE material discussed according to various embodiments discussed herein). One purpose of the intermediate metal layer 403 is to allow for damascene process of fabricating metal 402.

By applying voltage across metal 401 and 402, FE material 406 experiences stress/strain. The frequency of resonance of the strain/stress generated is determined by the thickness t of the ferroelectric material 406 along the z-direction.

FIGS. 5A-B illustrate depiction of actuations 500 and 520 the FE-Cap of FIG. 4 with strain causing expansion of the COB structure in the presence of positive voltage across layers 401 and 402 and first polarization (e.g., state 131), and strain causing contraction of the COB structure with second polarization (e.g., state 132 of FIG. 1C), respectively, in accordance with some embodiments. The direction of polarization can be switched from one to another and this changes the response of polarization to AC voltage. Switching the direction of polarization (i.e., polling) the ferroelectric modifies the strain response to the applied AC voltage. In this FE-Cap structure, exhibits bulk expansion and contraction. This AC voltage can be applied via a transistor coupled in series with the FE-structure 400 (e.g., a drain of an n-type transistor is coupled to metal layer 401 while layer 402 is biased with another voltage).

Figure 6:
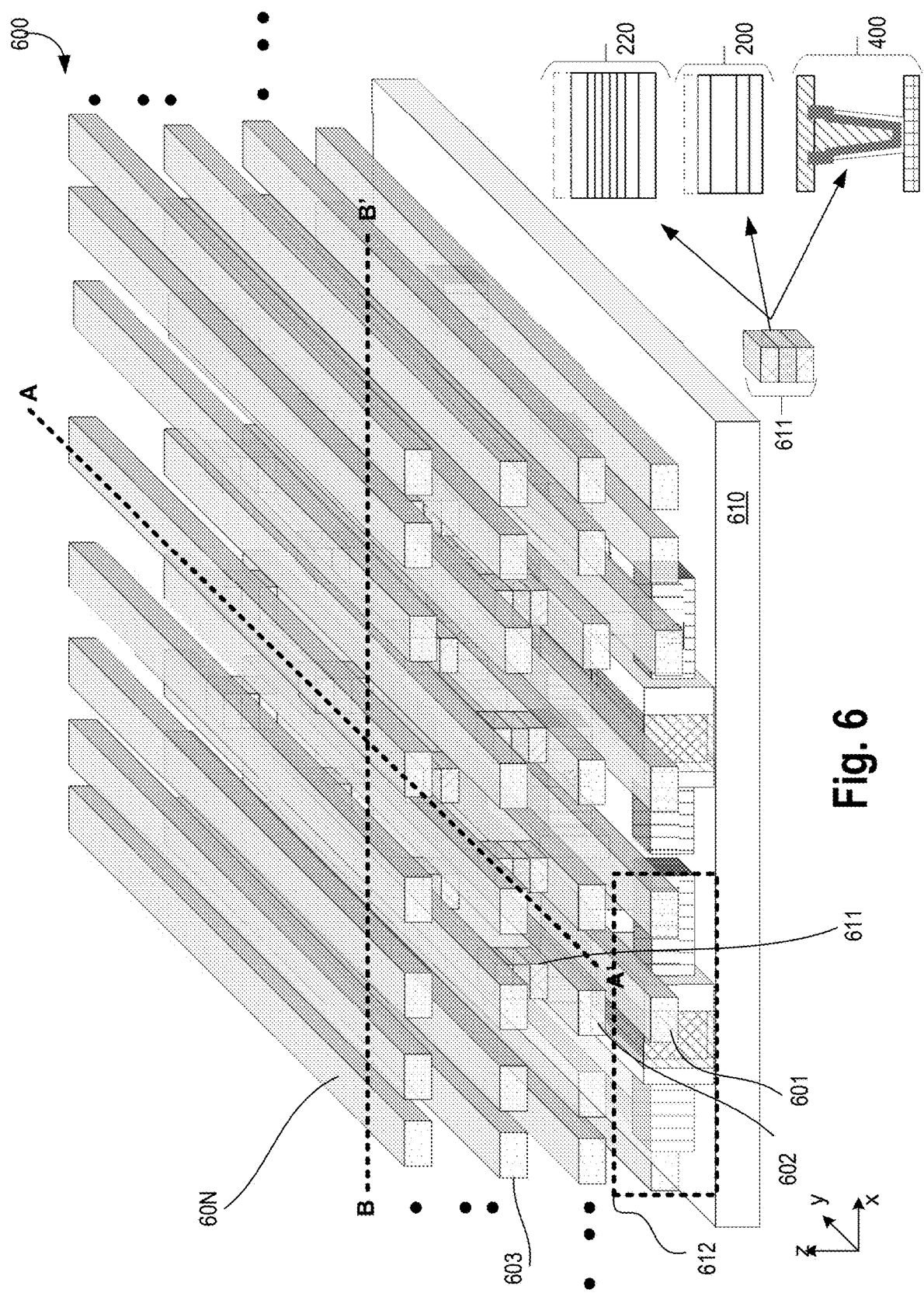
FIG. 6 illustrates a three-dimensional (3D) array of FE-Caps forming an acoustic waveguide with Bragg reflector adjacent to the FE-Caps, in accordance with some embodiments.

FIG. 6 illustrates apparatus 600 comprising a three-dimensional (3D) array of FE-Caps forming an acoustic waveguide with Bragg reflector adjacent to the FE-Caps, in accordance with some embodiments. With the backdrop of FE based capacitors discussed herein that are biased to operate as high efficiency resonators, phononic trans-conductance of the resonating signal can be achieved using Bragg reflectors, in accordance with some embodiments. Apparatus 600 comprises a plurality of metal layers 601, 602, 603, to 60N (where N is an integer), FE-caps 611, and transistors 612. The FE-Caps 611 can be one of FE-caps structures 200 of FIG. 2A, 220, of FIG. 2B, or 400 or FIG. 4.

With reference to FIG. 6, in some embodiments, metal interconnects are formed in parallel above transistors that are used to control the direction of current through the series coupled FE-Caps 611. In this example, a non-planar transistor 612 (e.g., a finFET or a tri-gate transistor) over substrate 610 is shown coupled in series to FE-caps in one row. For example, an n-type non-planar transistor 612 is provided with its drain terminal coupled to metal layer 602, which in turn is coupled to a terminal of the FE-capacitor. The embodiments, however, are not limited to non-planar transistors. Other types of transistors (e.g., planar transistors) may be used. In some embodiments, transistors fabricated in the backend are used with the FE-caps in the backend. In one such embodiment, the entire resonator and its control circuity are formed in the backend. In some embodiments, one transistor is used to control one set of FE-caps (or a row of FE-caps along the y-direction).

Metal interconnects above and below metal layers 601 and 603 may not couple to one another and may be unbiased. For example, metal lines 604 (above layer 603) are fabricated parallel over metal lines 603, while metal lines 601 are fabricated parallel below metal line 602. As such, an acoustic waveguide is formed for resonating signals to traverse between the metal lines 604 and 601 interconnects. To further guard the propagation of resonating signals, additional metal layers 605 (not shown, but is over layer 604) through 60N (where 'N' is greater than 5) may be fabricated. These interconnects may not couple with one another and may be unbiased. In some embodiments, interconnects 605 through 60N are coupled to ground or a power supply.

While the embodiment of FIG. 6 illustrates metal interconnects traversing along the y-axis, they can also traverse along the x-axis. In some embodiments, metal layer 601 runs orthogonal to metal layer 602. For example, metal layer 601 extents in the y-direction, while metal layer 602 extends in the x-direction.

In some embodiments, metal or poly structures are along formed on either sides of the set of transistors 612. For example, poly or metal layer 0 structures along the y-direction may be formed over substrate 610. This allows to enclose the waveguides more to retain the trans-conductance of the resonating signal along a particular direction.

Figure 7:
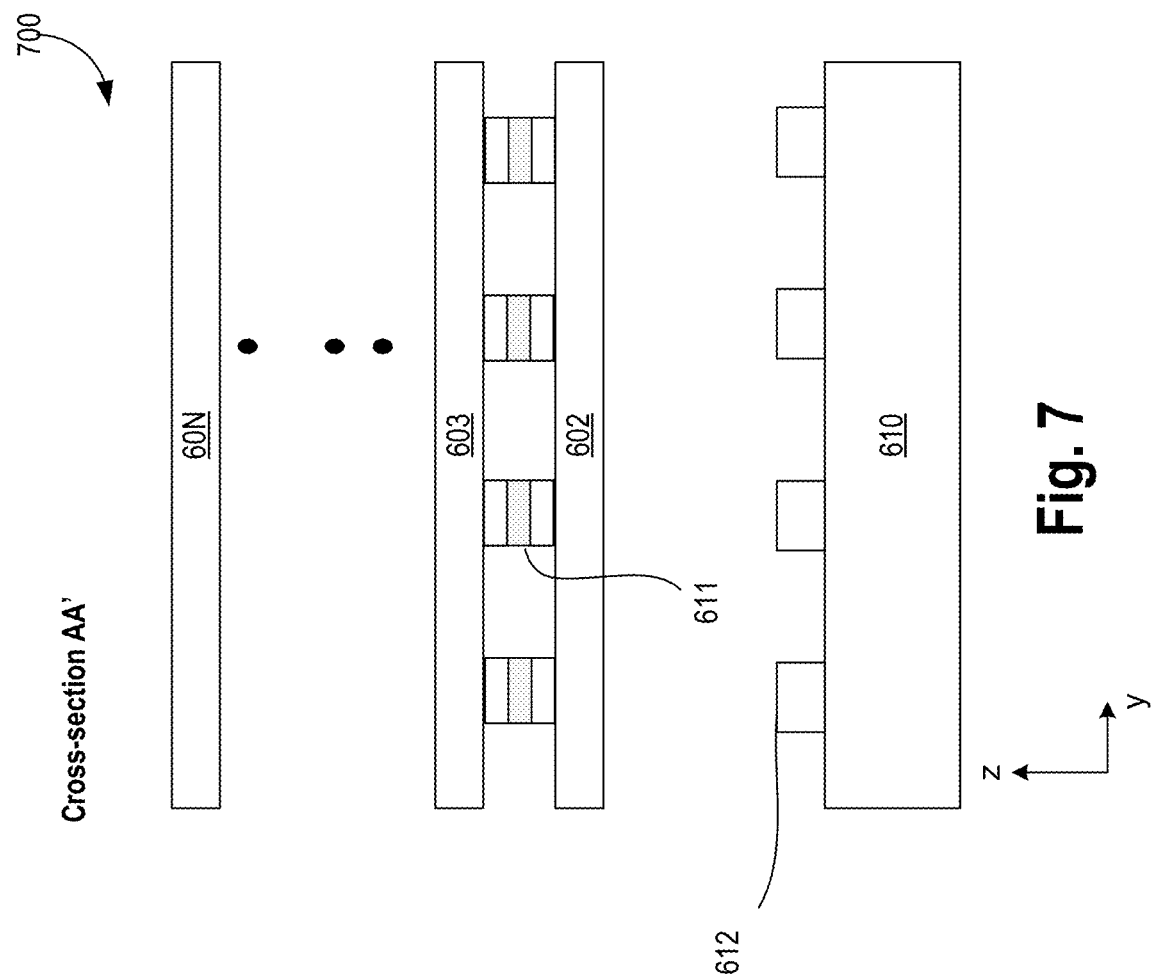
FIG. 7 illustrates a cross-section along the y-direction of the 3D array of FIG. 6, in accordance with some embodiments.

FIG. 7 illustrates cross-section 700 along the y-direction of the 3D array of FIG. 6, in accordance with some embodiments. Cross-section shows one row of capacitors 611 between metal layers 602 and 603. In various embodiments, vias are coupled to the metal layers of capacitor 611 and those vias are then coupled to respective interconnects 602 and 603. Metal layers above and below metal lines 602 and 603 may not be directly coupled to one another using vias, and are used for providing the "walls" for the acoustic resonator, in accordance with some embodiments.

Figure 8:
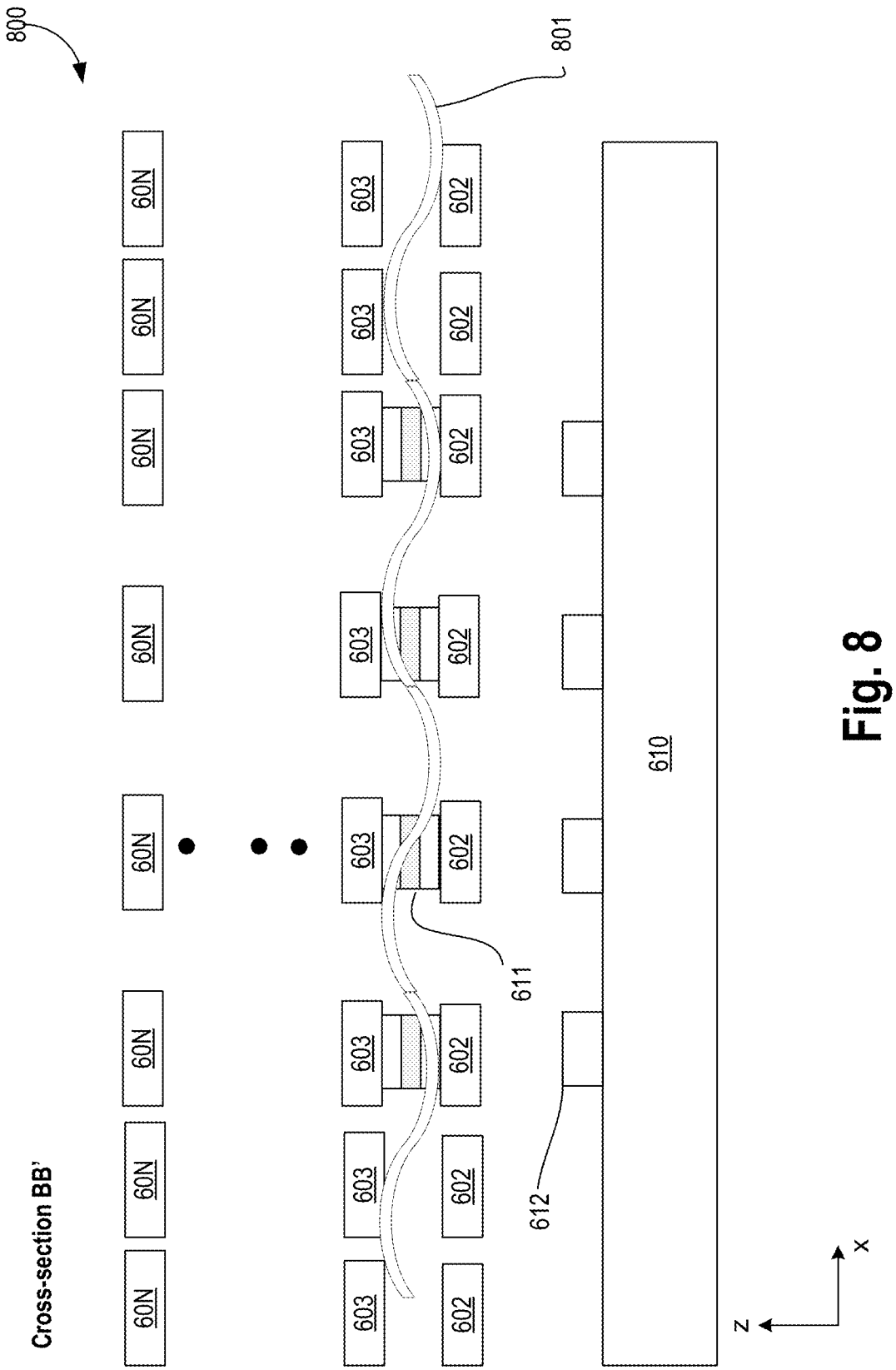
FIG. 8 illustrates a cross-section along the x-direction of the 3D array of FIG. 6, in accordance with some embodiments.

FIG. 8 illustrates cross-section 800 along the x-direction of the 3D array of FIG. 6, in accordance with some embodiments. Cross-section 800 also shows acoustic wave 801 travelling within the array of FE-Caps 611. The Control circuits comprising transistors 612 in the logic layers can be used to poll the FE-Caps 611 in a particular orientation to change the response of the array. The array can be 2D array to get an increased response and have multiple frequency options.

Figure 9:
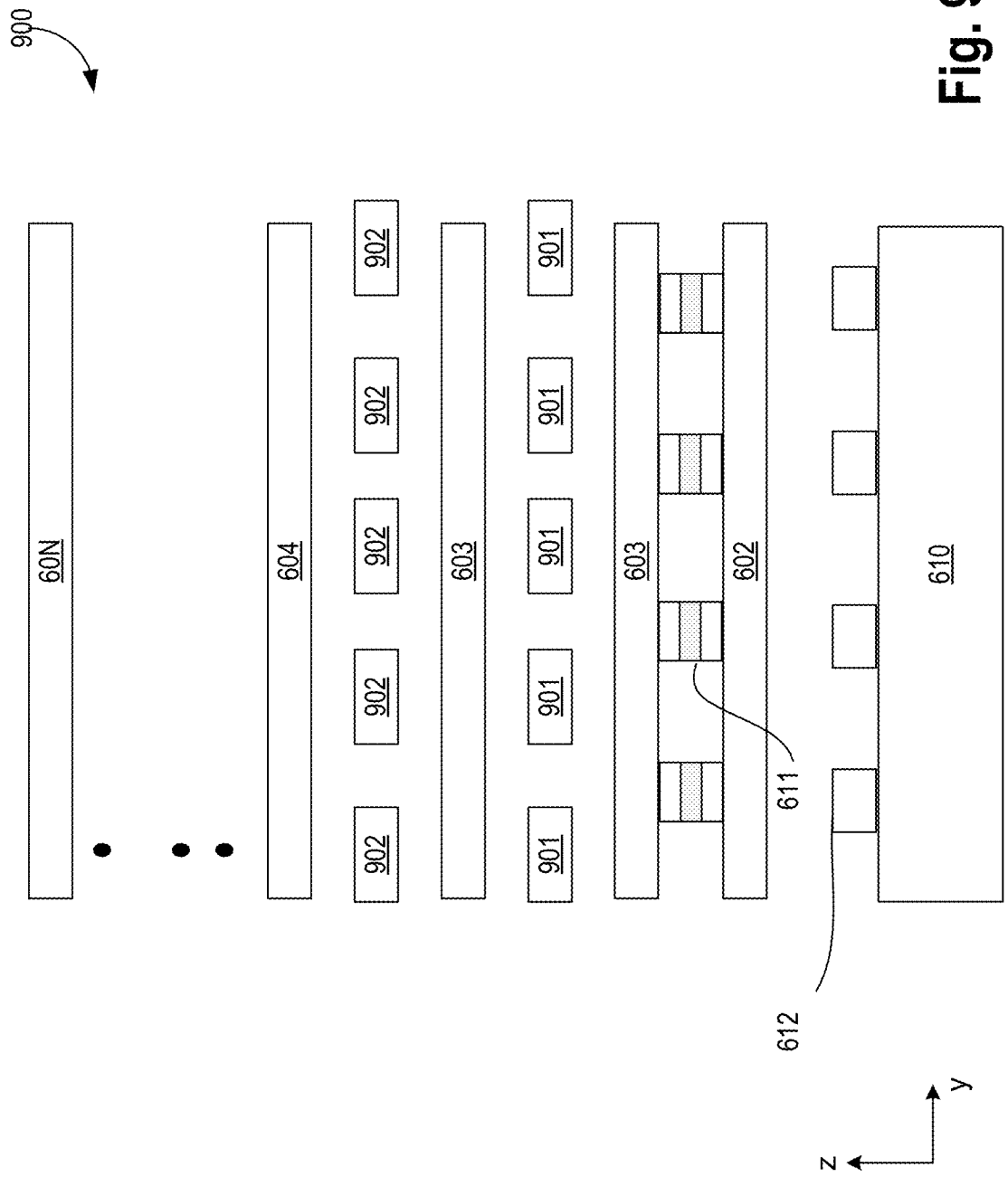
FIG. 9 illustrates a cross-section along a y-direction of a 3D array of an acoustic waveguide with alternating orthogonal metal layers, in accordance with some embodiments.

FIG. 9 illustrates cross-section 900 along a y-direction of a 3D array of an acoustic waveguide with alternating orthogonal metal layers, in accordance with some embodiments. Here, metal lines 901 and 902 are parallel to one another but substantially orthogonal to metal lines 602, 603, 604, and so on. This embodiment is an alternative to using parallel metal lines only for acoustic resonator waveguide. As such, metal layers form a mesh such that alternating layers are orthogonal to one another. Any number of layers can be stacked over the resonating FE-Caps. These metal layers in the mesh may not couple with one another and may be unbiased. In some embodiments, these metal layers are coupled to ground or a power supply.

Figure 10:
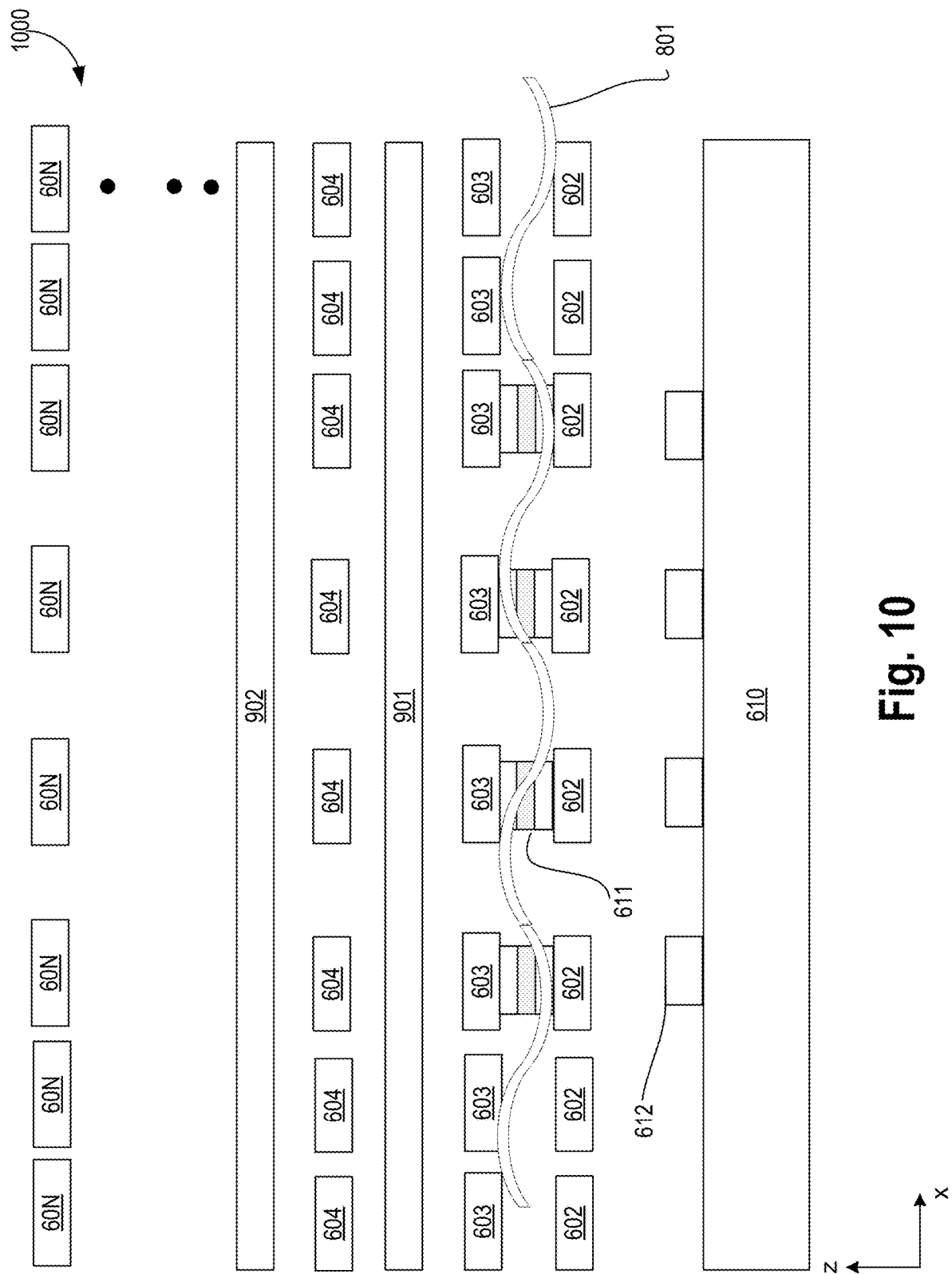
FIG. 10 illustrates a cross-section along an x-direction of a 3D array of an acoustic waveguide with alternating orthogonal metal layers, in accordance with some embodiments.

FIG. 10 illustrates cross-section 1000 along an x-direction of the 3D array of the acoustic waveguide of FIG. 9 with alternating orthogonal metal layers, in accordance with some embodiments.

Figure 11:
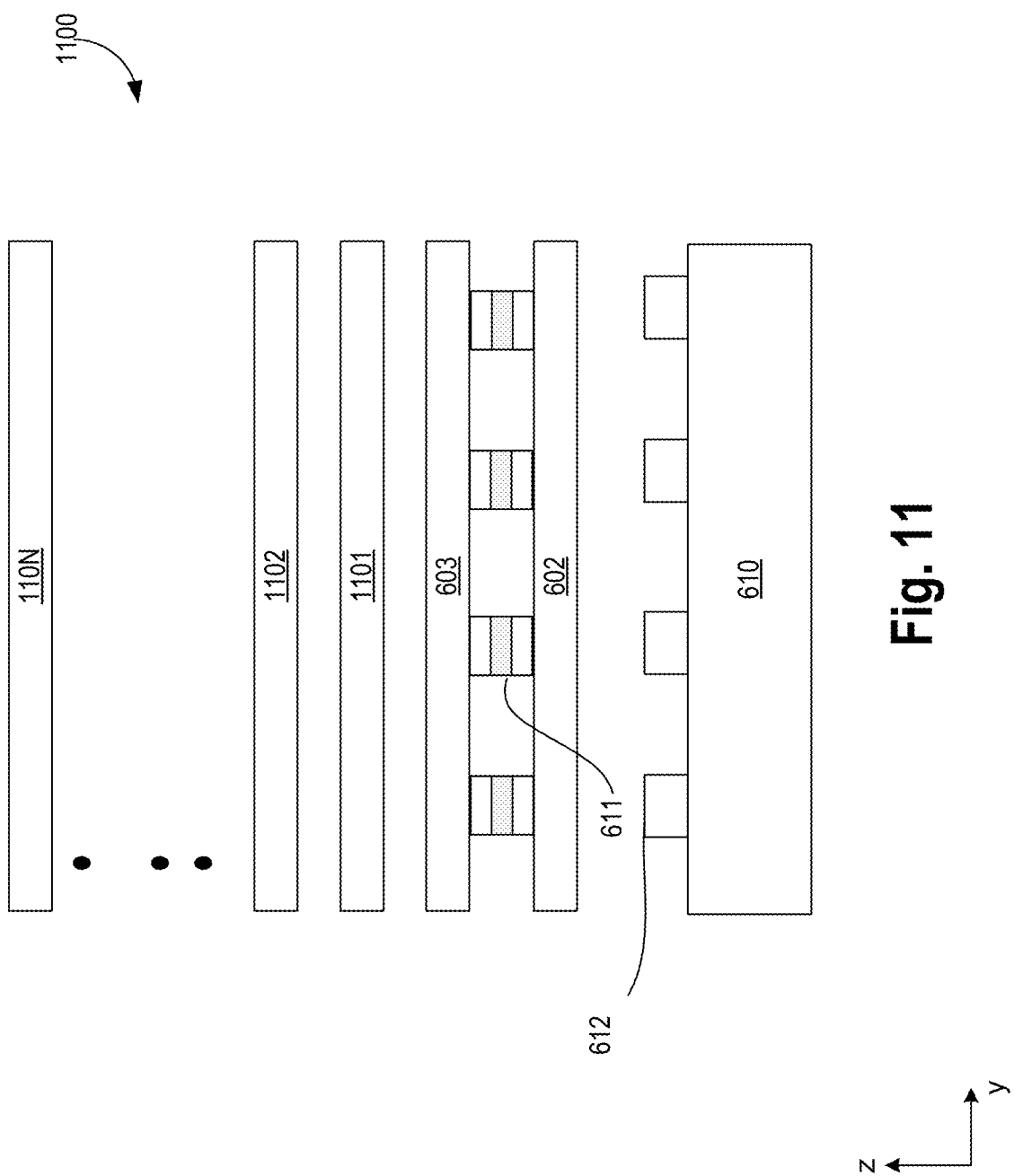
FIG. 11 illustrates a cross-section along a y-direction of a 3D array of an acoustic waveguide with solid metal layers, in accordance with some embodiments.

FIG. 11 illustrates cross-section 1100 along a y-direction of a 3D array of an acoustic waveguide with solid metal layers, in accordance with some embodiments. Here, solid metal layers are used without gaps. These metal layers extend along the x-y plane over the entire region having the FE-caps. These metal layers 1101, 1102, through 110N may not couple with one another and may be unbiased. In some embodiments, the metal layers 1101 through 110N are coupled to ground or a power supply.

Figure 12:
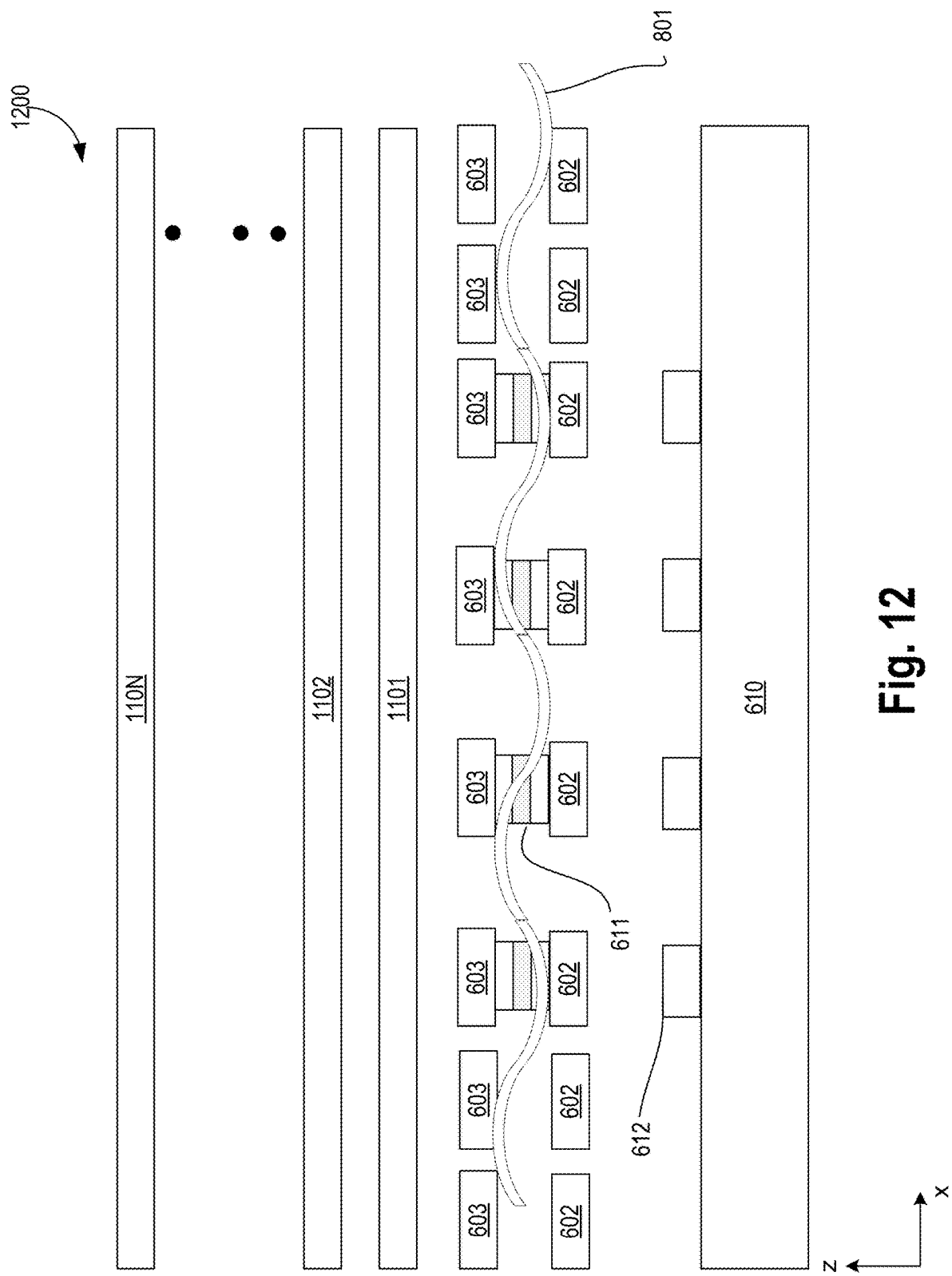
FIG. 12 illustrates a cross-section along an x-direction of a 3D array of an acoustic waveguide with solid metal layers, in accordance with some embodiments.

FIG. 12 illustrates cross-section 1200 along an x-direction of the 3D array of an acoustic waveguide of FIG. 11 with solid metal layers, in accordance with some embodiments. Other modifications and alternatives described with reference to other embodiments are also applicable here. For example, metal layers or vias can be formed along the sides of the transistors and/or the FE-caps to further improve the trans-conductance of the resonating signals.

Figure 13:
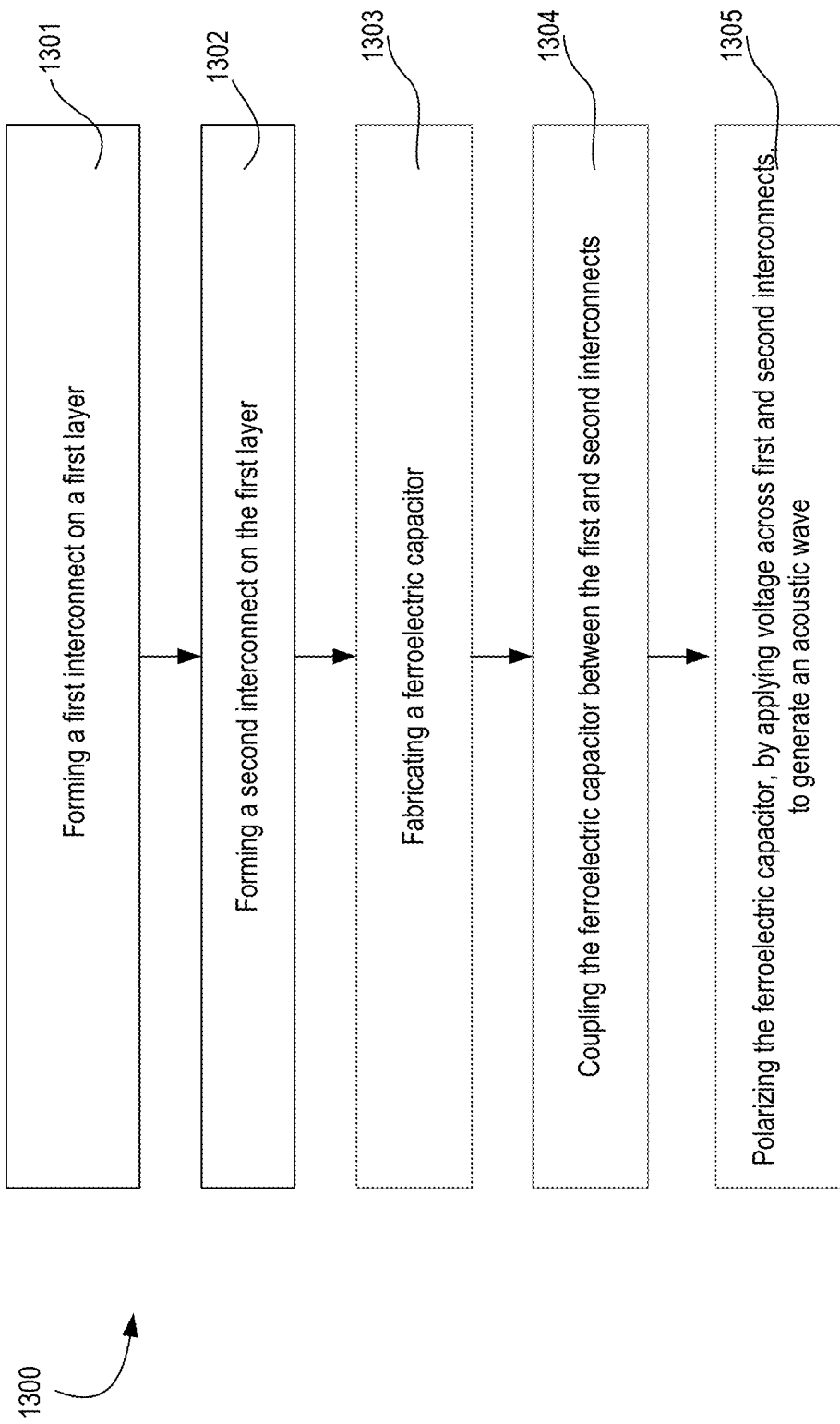
FIG. 13 illustrates a flowchart of a method for forming an acoustic waveguide with Bragg reflectors and with FE-Caps, in accordance with some embodiments.

FIG. 13 illustrates flowchart 1300 of a method for forming an acoustic waveguide with Bragg reflectors and with FE-Caps as discussed with reference to FIGS. 6-12, in accordance with some embodiments. While the following blocks (or process operations) in the flowchart are arranged in a certain order, the order can be changed. In some embodiments, some blocks can be executed in parallel.

At block 1301, a first interconnect (e.g., 602) is formed comprising metal (e.g., Cu, Al, Graphene, Cobalt, etc.), wherein the first interconnect is on a first layer (e.g., metal layer 4). At block 1302, a second interconnect (e.g., 603) is formed comprising metal (e.g., Cu, Al, Graphene, Cobalt, etc.), wherein the second interconnect is on a second layer and is parallel to the first interconnect. At block 1303, an FE-cap is fabricated. Example, MIM based FE-cap (e.g., those discussed with reference to FIGS. 2A-B) or COB (as discussed with reference to FIG. 4) is fabricated. To form an array, multiple such capacitors are fabricated. These capacitors are coupled between the first and second interconnects 602 and 603, at block 1304. In various embodiments, one or more transistors are fabricated and coupled to the capacitor(s). These transistors can be in the frontend (e.g., in or adjacent to substrate 610) or in the backend. These transistors are used to control the flow of current through the FE-caps to change the polarization of the FE-caps. At block 1305, the FE-caps are polarized. By switching the polarization (e.g., by polling), the FE-caps actuate and generate stress/strain which in turn produce acoustic waves. These acoustic waves can be contained within layers of metal as discussed with reference to FIGS. 6-12.

In some embodiments, the method further comprises fabricating a third interconnect (e.g., 604) comprising metal, wherein the third interconnect is above layer 603. The third interconnect can be parallel or orthogonal to metal layer 603. In some embodiments, the method comprises forming a fourth interconnect (e.g., 601) comprising metal, wherein the fourth interconnect is parallel to the third interconnect, and wherein the third and fourth interconnects are not coupled to one another. In some embodiments, the fourth interconnect is below the second interconnect. The third or fourth interconnects can be metal lines or solid metal planes, in accordance with some embodiments.

Figure 14:
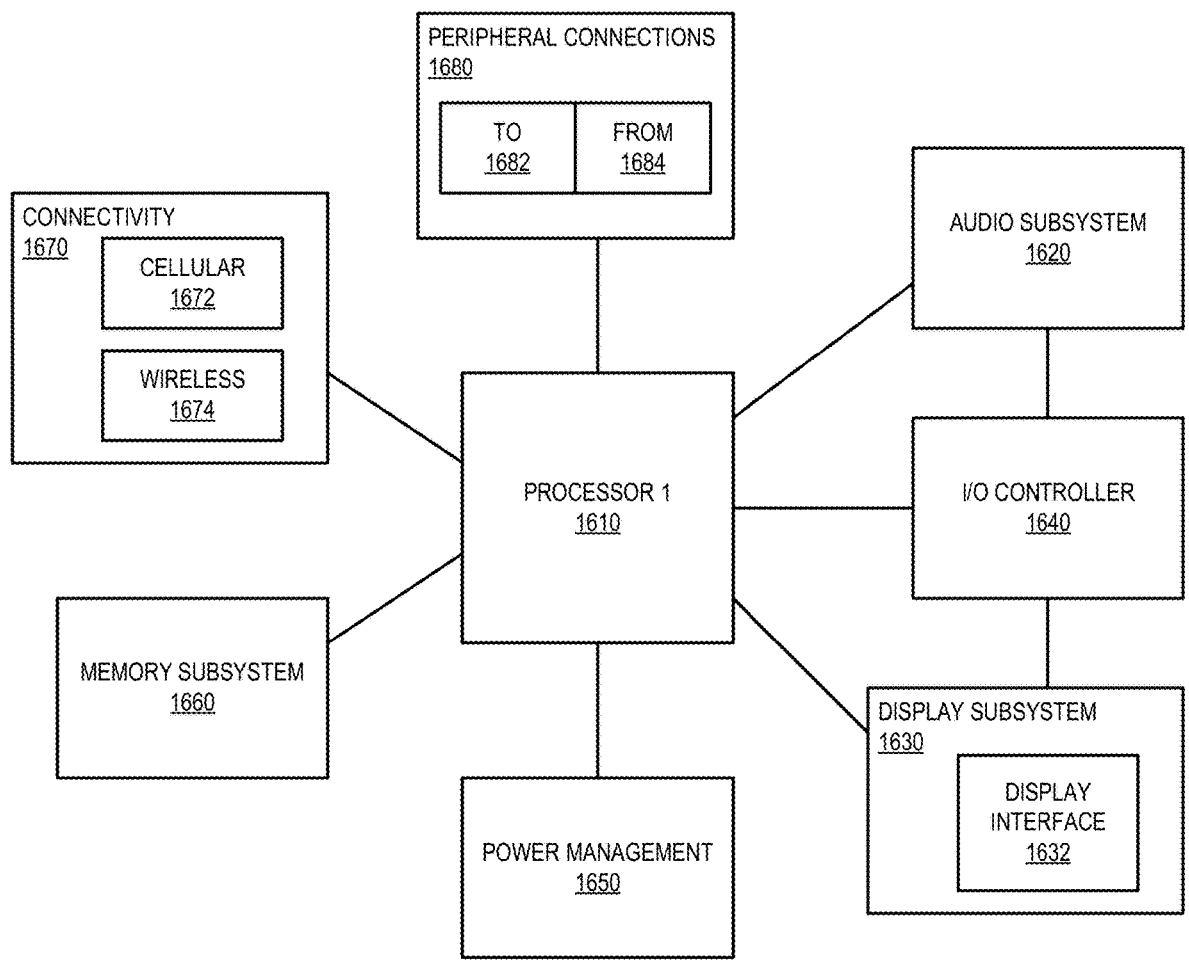
FIG. 14 illustrates a smart device or a computer system or a SoC (System-on-Chip) with an acoustic waveguide with Bragg reflectors and with FE-Caps, according to some embodiments of the disclosure.

FIG. 14 illustrates a smart device or a computer system or a SoC (System-on-Chip) with an acoustic waveguide with Bragg reflectors and with FE-Caps, according to some embodiments of the disclosure. FIG. 14 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with an acoustic waveguide with Bragg reflectors adjacent to a multi-gate transistor having FE material, according to some embodiments discussed. Other blocks of the computing device 1600 may also include one or more devices according to any one of devices of FIGS. 1-12, according to some embodiments. The FE-Caps are used to provide an acoustic waveguide and a less expensive, stable, and small resonant on-chip device suitable for monolithic integration in SoCs that include radiofrequency (RF) and/or wireless components such as oscillators, filters, and other components that require resonator elements. Periodically exciting the FE dielectric regions causes periodic Coulombic forces that forms a resonant device, such as an oscillator. The compact oscillators realized by nano-mechanical acoustic resonant devices enable non-Boolean architectures for specialized computing (e.g., pattern recognition applications that rely on synchronized resonance of arrays of oscillators).

Thus, embodiments of CMOS based nano-mechanical resonant devices described herein: (1) provide on chip resonant structures (while avoiding or limiting use of inductors and capacitors), (2) enable circuits with a wide frequency operation range (e.g., 1 GHz-100 GHz and spanning several wireless bands), (3) reduce the number of discrete components needed for wireless and RF applications, and/or (4) enable on chip frequency sources for clocking and non-Boolean computing.

Due to the high Q factor provided by FE dielectric materials that form the mechanical acoustic oscillators, the frequency content of the embodiments described herein are stable, have low phase noise, and thereby obviate the need (wholly or partially) for expensive off-chip crystal oscillators for RF circuits (e.g., oscillators, resonators, switches, filters) and/or high speed input/output (I/O) systems. Such embodiments are suitable for, as an example, synchronous logic and microprocessor components requiring inexpensive, highly stable, low jitter, high frequency clock signals in a standard CMOS process. Such embodiments may also be used in, for example, narrowband RF switches or filters at high frequency.

Various embodiments described herein use PZRs that provide high-Q, on-chip resonators compatible with multi-gate (e.g., tri-gate) transistor process technology. Such on-chip resonators are used for 10's of GHz RF filters and oscillators and/or novel computing systems such as the pattern recognition by synchronization of coupled nano-oscillators (i.e., non-Boolean computing). Consequently, PZRs provide improvements over RF filters realized by FBARs, which are off-chip elements that require special packaging. Further, embodiments provide improvements over coupled nano-oscillators for non-Boolean computing that include RBTs and/or resonant body oscillators (RBOs).

The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments are illustrated as examples. These each example can be combined with any other example where suitable. Some examples are described here.

Example 1. An apparatus comprising: a first metal line; a second metal line parallel to the first metal line; a capacitor comprising ferroelectric (FE) structure, wherein the capacitor is coupled between the first and second metal lines; and circuitry to switch direction of polarization of the capacitor.

Example 2. The apparatus of example 1, wherein the FE structure includes O and Hf.

Example 3. The apparatus of example 2, wherein the FE structure is doped by a dopant including one of: silicon, zirconium, lanthanum, or aluminum.

Example 4. The apparatus of example 3, wherein the dopant has a concentration between about 3% and 30% by weight.

Example 5. The apparatus of example 1, wherein the circuitry comprises one or more transistors to switch direction of polarization of the FE material of the capacitor to mechanically resonate the capacitor at a frequency generate periodic acoustic wave between the first and second metal lines.

Example 6. The apparatus of example 1, wherein the capacitor includes one of: metal-insulator-metal (MIM) capacitors or capacitor-on-bitline (COB) capacitor.

Example 7. The apparatus of example 1, wherein the capacitor is positioned in a backend of a die, and wherein the circuitry is fabricated in a frontend of the die.

Example 8. The apparatus of example 1 comprising: a first layer of metals extending parallel to one another, wherein the first layer of metals is above the first metal line; and a second layer of metals extending parallel to one another, wherein the second layer of metals is below the second metal line.

Example 9. The apparatus of example 8, wherein the first and second layers of metals is unbiased.

Example 10. The apparatus of example 1, wherein the ferroelectric structure includes: a first layer comprising metal; a second layer comprising metal; and two or more layers coupled between the first and second layers, wherein the two or more layers include a first layer comprising a conductive oxide, a second layer comprising a conductive oxide, and a third layer comprising a perovskite, wherein the third layer is adjacent to the first and second layers.

Example 11. The apparatus of example 10, wherein the two or more layers comprises a fourth layer adjacent to one of the first or second layers, and wherein the fourth layer comprises a conductive seed layer.

Example 12. The apparatus of example 11, wherein the fourth layer includes one of: Ti, Al, Nb, La, or STO.

Example 13. The apparatus of example 11, wherein the fourth layer includes one of: TiAl, Nb doped STO, or La doped STO.

Example 14. The apparatus of example 10, wherein the first and second layers include one of: Sr, Ru, La, Sr, Mn, Nb, Cr, or O.

Example 15. The apparatus of example 10, wherein the third layer includes one of: Sr, Ti, O, Bi, Fe, or Ba.

Example 16. The apparatus of example 10, wherein the third layer includes a super lattice of $PbTiO_3$ (PTO) and $SrTiO_3$ (STO).

Example, 17. The apparatus of example 16, wherein the super lattice of PTO and STO are repeated in a range of 2 to 100 times.

Example, 18. An apparatus comprising: a first plurality of metal lines extending in a first direction; an array of capacitors comprising ferroelectric material; a second plurality of metal lines extending in the first direction, wherein the array of capacitors is coupled between the first and second plurality of metal lines; a third plurality of metal lines extending in a second direction, wherein the third plurality of metal lines is above the first plurality of lines, and wherein the second direction is substantially orthogonal to the first direction; a fourth plurality of metal lines extending in the second direction, wherein the fourth plurality of metal lines is below the second plurality of lines; and circuitry to switch direction of polarization of at least one capacitor of the array of capacitors.

Example 19. The apparatus of example 18, wherein the at least one capacitor includes one of: metal-insulator-metal (MIM) capacitors or capacitor-on-bitline (COB) capacitor.

Example 20. A system comprising: a memory; a processor coupled to the memory, wherein the processor includes an acoustic resonator comprising: a first plurality of metal lines extending in a first direction; an array of capacitors comprising ferroelectric material; a second plurality of metal lines extending in the first direction, wherein the array of capacitors is coupled between the first and second plurality of metal lines; and a circuitry to switch polarization of at least one capacitor of the array of capacitors; and a communication interface to allow the processor to communicate with another device.

Example 21. The system of example 20, wherein the at least one capacitor includes one of: metal-insulator-metal (MIM) capacitors or capacitor-on-bitline (COB) capacitor.

Example 22. The system of example 20, wherein the acoustic resonator comprises: a third plurality of metal lines extending in a second direction, wherein the third plurality of metal lines is above the first plurality of lines, and wherein the second direction is substantially orthogonal to the first direction; and a fourth plurality of metal lines extending in the second direction, wherein the fourth plurality of metal lines is below the second plurality of lines.

Example 23. The system of example 20, wherein the acoustic resonator comprises: a third plurality of metal lines extending in the first direction, wherein the third plurality of metal lines is above the first plurality of lines; and a fourth plurality of metal lines extending in the first direction, wherein the fourth plurality of metal lines is below the second plurality of lines.

Example 24. The system of example 20, wherein the ferroelectric material is part of a structure which includes: a first layer comprising metal; a second layer comprising metal; and two or more layers coupled between the first and second layers, wherein the two or more layers include a first layer comprising a conductive oxide, a second layer comprising a conductive oxide, and a third layer comprising a perovskite, wherein the third layer is adjacent to the first and second layers.

Example 25. The system of example 20, wherein the FE material includes O, Hf, and a dopant, and wherein the dopant includes one of: silicon, zirconium, lanthanum, or aluminum.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first metal line;
   a second metal line parallel to the first metal line;
   a capacitor comprising a ferroelectric (FE) structure, wherein the capacitor is coupled between the first and second metal lines, the FE structure comprises O and Hf, the FE structure is doped by a dopant comprising one of silicon, zirconium, lanthanum, or aluminum, and the dopant has a concentration between about 3% and 30% by weight; and
   circuitry to switch a direction of polarization of the capacitor.

2. The apparatus of claim 1, wherein the circuitry comprises one or more transistors to switch the direction of polarization of the FE material of the capacitor to mechanically resonate the capacitor at a frequency to generate periodic acoustic waves between the first and second metal lines.

3. The apparatus of claim 1, wherein the capacitor comprises one of a metal-insulator-metal (MIM) capacitor or a capacitor-on-bitline (COB) capacitor.

4. The apparatus of claim h comprising:
   a first layer of metals extending parallel to one another, wherein the first layer of metals is above the first metal line; and
   a second layer of metals extending parallel to one another, wherein the second layer of metals is below the second metal line.

5. The apparatus of claim 1, wherein the ferroelectric structure comprises:
   a first layer comprising metal;
   a second layer comprising metal; and
   two or more layers coupled between the first and second layers, wherein the two or more layers comprise a first layer comprising a conductive oxide, a second layer comprising a conductive oxide, and a third layer comprising a perovskite, wherein the third layer is adjacent to the first and second layers.

6. The apparatus of claim 1, comprising:
   a memory;
   a processor coupled to the memory, wherein the processor comprises an acoustic resonator comprising the first metal line, the second metal line, the capacitor, and the circuitry; and
   a communication interface to allow the processor to communicate with another device.

7. An apparatus, comprising
   a first metal line;
   a second metal line parallel to the first metal line;
   a capacitor comprising a ferroelectric (FE) structure, wherein the capacitor is coupled between the first and second metal lines; and
   circuitry to switch a direction of polarization of the capacitor, wherein the capacitor is positioned in a backend of a die, and the circuitry is positioned in a frontend of the die.

8. The apparatus of claim 7, wherein the FE structure comprises O and Hf.

9. The apparatus of claim 8, wherein the FE structure is doped by a dopant comprising one of silicon, zirconium, lanthanum, or aluminum.

10. The apparatus of claim 9, wherein the dopant has a concentration between about 3% and 30% by weight.

11. The apparatus of claim 7, wherein the circuitry comprises one or more transistors to switch the direction of polarization of the FE material of the capacitor to mechanically resonate the capacitor at a frequency to generate periodic acoustic waves between the first and second metal lines.

12. The apparatus of claim 7, wherein the capacitor comprises one of a metal-insulator-metal (MIM) capacitor or a capacitor-on-bitline (COB) capacitor.

13. The apparatus of claim 7, comprising:
a first layer of metals extending parallel to one another, wherein the first layer of metals is above the first metal line; and
a second layer of metals extending parallel to one another, wherein the second layer of metals is below the second metal line.

14. The apparatus of claim 7, wherein the ferroelectric structure comprises:
a first layer comprising metal;
a second layer comprising metal; and
two or more layers coupled between the first and second layers, wherein the two or more layers comprise a first layer comprising a conductive oxide, a second layer comprising a conductive oxide, and a third layer comprising a perovskite, wherein the third layer is adjacent to the first and second layers.

15. The apparatus of claim 7, comprising:
a memory;
a processor coupled to the memory, wherein the processor comprises an acoustic resonator comprising the first metal line, the second metal line, the capacitor, and the circuitry; and
a communication interface to allow the processor to communicate with another device.

16. A resonator, comprising
a first metal line;
a second metal line parallel to the first metal line;
a capacitor comprising a ferroelectric (FE) structure, wherein the capacitor is coupled between the first and second metal lines;
a phononic grating, wherein the first metal line, the second metal line, and the capacitor are isolated by the phononic grating, the phononic grating comprising:
a first metal layer comprising a plurality of parallel first metal interconnects in a first plane over the first metal line; and
a second metal layer comprising a plurality of parallel second metal interconnects in a second plane below the second metal line, wherein the first metal line, the second metal line, and the capacitor are between the first plane and the second plane; and
one or more transistors to switch a direction of polarization of the capacitor.

17. The resonator of claim 16, wherein the first metal interconnects and the second metal interconnects are not coupled to one another and are unbiased.

18. The resonator of claim 16, wherein the first metal line, the second metal line, the plurality of parallel first metal interconnects, and the plurality of parallel second metal interconnects are substantially parallel to one another.

19. The resonator of claim 18, further comprising:
a third metal layer comprising a plurality of parallel third metal interconnects in a third plane over the first plane.

20. The resonator of claim 19, further comprising:
a fourth metal layer comprising a plurality of parallel fourth metal interconnects in a fourth plane over the third plane.

21. The resonator of claim 16, the one or more transistors to switch the direction of polarization of the FE material of the capacitor to mechanically resonate the capacitor at a frequency to generate periodic acoustic waves.

22. The resonator of claim 16, wherein the capacitor comprises one of a metal-insulator-metal (MIM) capacitor or a capacitor-on-bitline (COB) capacitor.

23. The resonator of claim 16, wherein the ferroelectric structure comprises:
a first layer comprising metal;
a second layer comprising metal; and
two or more layers coupled between the first and second layers, wherein the two or more layers comprise a first layer comprising a conductive oxide, a second layer comprising a conductive oxide, and a third layer comprising a perovskite, wherein the third layer is adjacent to the first and second layers.

24. The resonator of claim 16, wherein the FE structure comprises O and Hf.

25. The resonator of claim 24, wherein the FE structure is doped by a dopant comprising one of silicon, zirconium, lanthanum, or aluminum.

* * * * *